(12) United States Patent
Wu et al.

(10) Patent No.: US 11,727,968 B2
(45) Date of Patent: Aug. 15, 2023

(54) METHOD FOR SELF-CALIBRATING TDQSCK THAT IS SKEW BETWEEN RISING EDGE OF MEMORY CLOCK SIGNAL AND RISING EDGE OF DQS SIGNAL DURING READ OPERATION AND ASSOCIATED SIGNAL PROCESSING CIRCUIT

(71) Applicant: Elite Semiconductor Microelectronics Technology Inc., Hsinchu (TW)

(72) Inventors: Po-Hsun Wu, Hsinchu (TW); Jen-Shou Hsu, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 65 days.

(21) Appl. No.: 17/499,870

(22) Filed: Oct. 13, 2021

(65) Prior Publication Data
US 2023/0116769 A1 Apr. 13, 2023

(51) Int. Cl.
*G11C 7/22* (2006.01)
(52) U.S. Cl.
CPC .............. *G11C 7/222* (2013.01); *G11C 7/225* (2013.01); *G11C 2207/2254* (2013.01)
(58) Field of Classification Search
CPC .. G11C 7/222; G11C 7/225; G11C 2207/2254

USPC ......................................................... 365/233.1
See application file for complete search history.

(56) References Cited

U.S. PATENT DOCUMENTS

| 6,704,881 | B1 | 3/2004 | Li |
| 7,542,358 | B2 | 6/2009 | Jang |
| 7,990,786 | B2 | 8/2011 | Chu |
| 8,780,653 | B2 | 7/2014 | Ito |
| 10,320,398 | B2* | 6/2019 | Jeon ...................... G11C 7/1066 |
| 2004/0148538 | A1 | 7/2004 | Li |
| 2019/0171272 | A1* | 6/2019 | Patil ...................... G06F 1/3287 |
| 2021/0335403 | A1 | 10/2021 | Choi |

* cited by examiner

*Primary Examiner* — Huan Hoang
*Assistant Examiner* — Minh Dinh
(74) *Attorney, Agent, or Firm* — Winston Hsu

(57) ABSTRACT

A signal processing circuit includes a delay locked loop (DLL) circuit, a data output path circuit, and a first phase detector circuit. The DLL circuit is arranged to receive a memory clock signal, and generate a DLL output signal according to the memory clock signal and a DLL feedback signal. The data output path circuit is coupled to the DLL circuit, and is arranged to generate a DQS signal according to the DLL output signal. The first phase detector circuit is coupled to the data output path circuit, and is arranged to receive the memory clock signal and the DQS signal, and detect a phase difference between the memory clock signal and the DQS signal to generate a first phase detection result.

15 Claims, 7 Drawing Sheets

METHOD FOR SELF-CALIBRATING TDQSCK THAT IS SKEW BETWEEN RISING EDGE OF MEMORY CLOCK SIGNAL AND RISING EDGE OF DQS SIGNAL DURING READ OPERATION AND ASSOCIATED SIGNAL PROCESSING CIRCUIT

BACKGROUND OF THE INVENTION

1. Field of the Invention

The present invention is related to a dynamic random access memory (DRAM), and more particularly, to a method for self-calibrating a tDQSCK that is a skew between a rising edge of a memory clock signal and a rising edge of a data strobe (DQS) signal during a read operation and associated signal processing circuit.

2. Description of the Prior Art

For a DRAM, tDQSCK is defined in specification of the DRAM, which limits the relative relationship between a rising edge of a DQS signal and that of a memory clock signal during a read operation. That is, tDQSCK represents maximum and minimum tolerance values of a skew between the rising edge of the DQS signal and that of the clock signal during the read operation. The manufacturer of the DRAM will set the design target of tDQSCK to be smaller than tDQSCK that is defined by the specification of the DRAM. For example, the tDQSCK specified in the specification of the DRAM is ±150 picosecond (ps), and the manufacturer of the DRAM may make the tDQSCK of the DRAM smaller than ±150 ps. Ideally, the tDQSCK of the DRAM should be close to 0.

In practice, tDQSCKs of DRAMs manufactured by the manufacturer of the DRAM will be slightly different from one another. Although the tDQSCKs of the DRAMs manufactured by the manufacturer of the DRAM may all be smaller than the tDQSCK specified by the specification of the DRAM, distribution of the tDQSCK will be quite uneven. For example, assuming that a tDQSCK distribution chart has a horizontal axis showing tDQSCK values and a vertical axis showing numbers of DRAMs, if a setting for the tDQSCK is the same for each DRAM, the distribution of the numbers of DRAMs may not be concentrated at tDQSCK=0 but quite scattered. As a result, a method for self-calibrating tDQSCK regarding each DRAM and associated signal processing circuit are urgently needed.

SUMMARY OF THE INVENTION

It is therefore one of the objectives of the present invention to provide a method for self-calibrating a tDQSCK and associated signal processing circuit, to address above-mentioned issues.

According to one embodiment of the present invention, a signal processing circuit is provided. The signal processing circuit may include a delay locked loop (DLL) circuit, a data output path circuit, and a first phase detector circuit. The DLL circuit may be arranged to receive a memory clock signal, and generate a DLL output signal according to the memory clock signal and a DLL feedback signal, wherein the DLL feedback signal is derived from the DLL output signal. The data output path circuit may be coupled to the DLL circuit, and may be arranged to generate a DQS signal according to the DLL output signal. The first phase detector circuit may be coupled to the data output path circuit, and may be arranged to receive the memory clock signal and the DQS signal, and detect a phase difference between the memory clock signal and the DQS signal to generate a first phase detection result, wherein a first delay amount is employed by the DLL circuit, and the first delay amount is adjusted according to the first phase detection result.

According to one embodiment of the present invention, a method for self-calibrating a tDQSCK is provided. The method may include: entering a multi-purpose register (MPR) mode, a read preamble training mode, and a write leveling mode, and setting a tDQSCK setting by default; providing a read command and recording a write leveling state of a write leveling index signal, wherein the write leveling state of the write leveling index signal is indicative of phase relationship between a memory clock signal and a DQS signal; determining whether the tDQSCK is a maximum setting of the tDQSCK, wherein in response to the tDQSCK being not the maximum setting of the tDQSCK, a value of a delay amount is decreased to make the DQS signal shift forwards, the read command is provided again, and the write leveling state of the write leveling index signal is recorded again; in response to the tDQSCK being the maximum setting of the tDQSCK, setting the tDQSCK setting by default again; determining whether the tDQSCK is a minimum setting of the tDQSCK, wherein in response to the tDQSCK being not the minimum setting of the tDQSCK, the value of the delay amount is increased to make the DQS signal shift backwards, the read command is provided again, and the write leveling state of the write leveling index signal is recorded again; in response to the tDQSCK being the minimum setting of the tDQSCK, exiting the read preamble training mode, the write leveling mode, and the MPR mode; updating a tDQSCK setting code according to a plurality of recorded write leveling states of the write leveling index signal until the write leveling index signal toggles; and recording the tDQSCK setting code.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
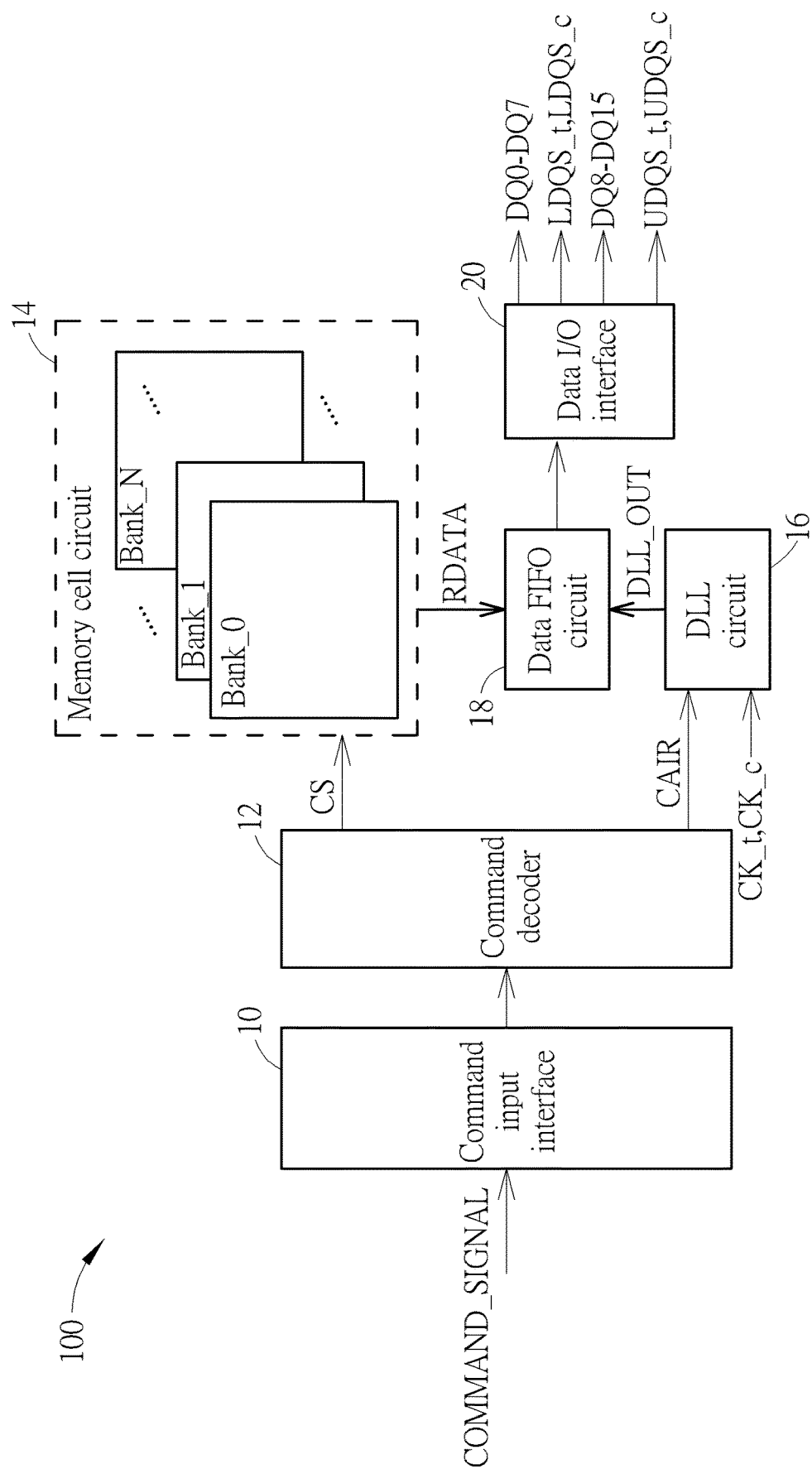
FIG. 1 is a block diagram illustrating a memory device according to an embodiment of the present invention.

FIG. 1 is a block diagram illustrating a memory device 100 according to an embodiment of the present invention.

The memory device 100 (e.g. the DRAM) may include a command input interface 10, a command decoder 12, a memory cell circuit 14, a delay locked loop (DLL) circuit 16, a data first input first output (FIFO) circuit 18, and a data input/output (I/O) interface 20. The command input interface 10 may be arranged to receive a plurality of command signals COMMAND_SIGNAL, wherein the plurality of command signals COMMAND_SIGNAL may include a read command RE, a differential pair of memory clock signals (i.e. a true clock signal CK_t and a complementary clock signal CK_c), a clock enable signal CKE, a chip select signal CS_n, a plurality of address signals (e.g. BG0, BG1, BA0, BA1, and A0-A13), etc. The command decoder 12 may be coupled to the command input interface 10, and may be arranged to receive and decode the plurality of command signals COMMAND_SIGNAL, to generate a command address signal CAIR and a control signal CS, wherein the command address signal CAIR corresponds to the read command RE, and the control signal CS is generated according to the plurality of address signals.

The memory cell circuit 14 may be coupled to the command decoder 12, and have a plurality of memory banks BANK_0-BANK_N, wherein the memory cell circuit 14 is controlled by the control signal CS, the control signal CS may be arranged to determine a memory address in one of the plurality of memory banks BANK_0-BANK_N, and a read operation corresponding to the read command RE is operated on the memory address to read a read data RDATA from the memory address. The DLL circuit 16 may be arranged to receive the command address signal CAIR and the differential pair of memory clock signals (i.e. the true clock signal CK_t and the complementary clock signal CK_c), and generate a DLL output signal DLL_OUT according to the memory clock signal (e.g. the true clock signal CK_t). The data FIFO circuit 18 may be coupled to the memory cell circuit 14 and the DLL circuit 16, and may be arranged to receive the read data RDATA and the DLL output signal DLL_OUT. The data I/O interface 20 may be coupled to the data FIFO circuit 18, and may be arranged to generate a plurality of data (DQ) signals DQ0-DQ7 and DQ8-DQ15, a differential pair of upper DQS signals (i.e. an upper true DQS signal UDQS_t and an upper complementary DQS signal UDQS_c), and a differential pair of lower DQS signals (i.e. a lower true DQS signal LDQS_t and a lower complementary DQS signal LDQS_c) according to the read data RDATA and the DLL output signal DLL_OUT, wherein the differential pair of upper DQS signals and the differential pair of lower DQS signals correspond to the plurality of DQ signals DQ8-DQ15 and the plurality of DQ signals DQ0-DQ7, respectively, and the plurality of DQ signals DQ0-DQ7 and DQ8-DQ15 correspond to the read data RDATA.

Figure 2:
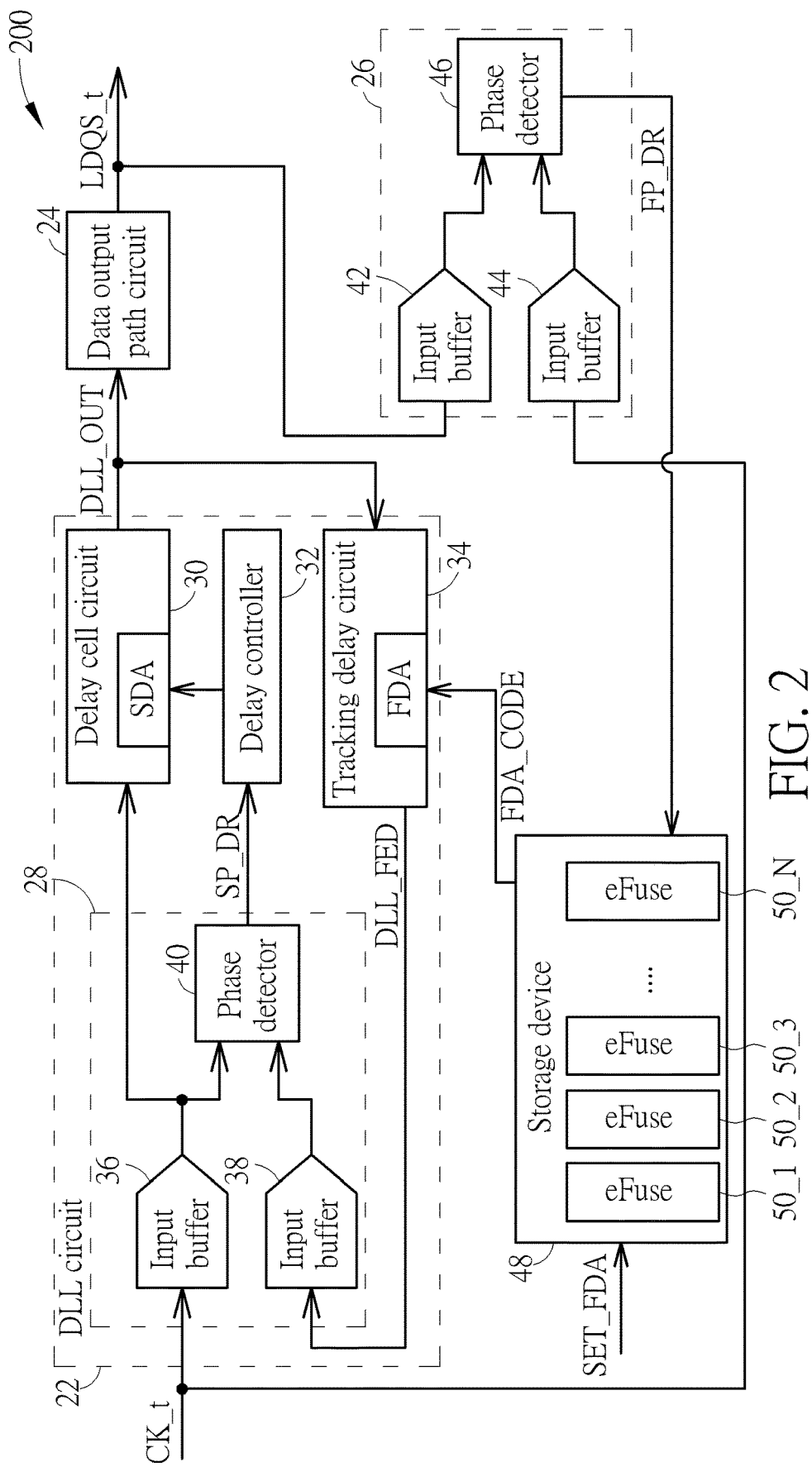
FIG. 2 is a diagram illustrating a signal processing circuit according to an embodiment of the present invention.

FIG. 2 is a diagram illustrating a signal processing circuit 200 according to an embodiment of the present invention. The signal processing circuit 200 may include a DLL circuit 22, a data output path circuit 24, a phase detector circuit 26, and a storage device 48, wherein the DLL circuit 16 shown in FIG. 1 may be implemented by the DLL circuit 22 shown in FIG. 2, and the data FIFO circuit 18 and the data I/O interface 20 shown in FIG. 1 may be implemented by the data output path circuit 24 shown in FIG. 2. Hence, the memory device 100 shown in FIG. 1 may be modified to include the proposed phase detector circuit 26 and the proposed storage device 48. In addition, since there is a write leveling function in a double data rate (DDR) 3 memory and a DDR 4 memory (i.e. the DDR3 memory and the DDR4 memory may include a write leveling circuit), the phase detector circuit 26 may be implemented by a phase detector circuit of the write leveling circuit, but the present invention is not limited thereto.

The DLL circuit 22 may be arranged to receive the true clock signal CK_t, and generate the DLL output signal DLL_OUT according to the true clock signal CK_t and a DLL feedback signal DLL_FED, wherein the DLL feedback signal DLL_FED is derived from the DLL output signal DLL_OUT. The data output path circuit 24 may be coupled to the DLL circuit 22, and may be arranged to generate the lower true DQS signal LDQS_t according to the DLL output signal DLL_OUT. The phase detector circuit 26 may be coupled to the data output path circuit 24 and the storage device 48, and may be arranged to receive the true clock signal CK_t and the lower true DQS signal LDQS_t, and detect a phase difference between the true clock signal CK_t and the lower true DQS signal LDQS_t to generate a first phase detection result FP_DR, wherein a first delay amount FDA may be employed by the DLL circuit 22, and the storage device 48 may be arranged to receive the first phase detection result FP_DR, and adjust the first delay amount FDA according to the first phase detection result FP_DR.

As shown in FIG. 2, the DLL circuit 22 may include a phase detector circuit 28, a delay cell circuit 30, a delay controller 32, and a tracking delay circuit 34. The phase detector circuit 28 may be arranged to receive the true clock signal CK_t and the DLL feedback signal DLL_FED, and detect a phase difference between the true clock signal CK_t and the DLL feedback signal DLL_FED to generate a second phase detection result SP_DR. The delay cell circuit 30 may be coupled to the phase detector circuit 28 and the data output path circuit 24, and may be arranged to apply a second delay amount SDA to the true clock signal CK_t to generate the DLL output signal DLL_OUT. The delay controller 32 may be coupled to the phase detector circuit 28 and the delay cell circuit 30, and may be arranged to control the second delay amount SDA of the delay cell circuit 30 according to the second phase detection result SP_DR. The tracking delay circuit 34 may be coupled to the phase detector circuit 28 and the delay cell circuit 30, and may be arranged to apply the first delay amount FDA to the DLL output signal DLL_OUT to generate the DLL feedback signal DLL_FED.

In addition, the phase detector circuit 28 may include a plurality of input buffers 36 and 38 and a phase detector 40. The input buffer 36 may be coupled to the delay cell circuit 30, and may be arranged to receive and buffer the true clock signal CK_t. The input buffer 38 may be coupled to the tracking delay circuit 34, and may be arranged to receive and buffer the DLL feedback signal DLL_FED. The phase detector 40 may be coupled to the input buffers 36 and 38 and the delay controller 32, and may be arranged to detect the phase difference between the true clock signal CK_t output from the input buffer 36 and the DLL feedback signal DLL_FED output from the input buffer 38, to generate and transmit the second phase detection result SP_DR to the delay controller 32. The phase detector circuit 26 may include a plurality of input buffers 42 and 44 and a phase detector 46. The input buffer 42 may be coupled to the data output path circuit 24, and may be arranged to receive and buffer the lower DQS true signal LDQS_t. The input buffer 44 may be arranged to receive and buffer the true clock signal CK_t. The phase detector 46 may be coupled to the input buffers 42 and 44 and the storage device 48, and may be arranged to detect the phase difference between the lower true DQS signal LDQS_t output from the input buffer 42 and the true clock signal CK_t output from the input buffer 44, to generate and transmit the first phase detection result FP_DR to the storage device 48.

It should be noted that, the memory device 100 (e.g. the DRAM) that includes the signal processing circuit 200 is operated in a multi-purpose register (MPR) mode, a read preamble training mode and a write leveling mode. The first phase detection result FP_DR may be arranged to serve as a write leveling index signal WL_INDEX, and a write leveling state WS of the write leveling index signal WL_INDEX is indicative of phase relationship between the true clock signal CK_t and the lower true DQS signal LDQS_t. In addition, the storage device 48 may be further arranged to generate and transmit a first delay amount adjustment signal FDA_CODE to the tracking delay circuit 34 according to the first phase detection result FP_DR, to adjust the first delay amount FDA. For example, when the write leveling state WS of the write leveling index signal WL_INDEX is equal to 1 (i.e. the level of the write leveling index signal WL_INDEX is high), the lower true DQS signal LDQS_t lags behind the true clock signal CK_t, and the tracking delay circuit 34 may increase a value of the first delay amount FDA to make the lower true DQS signal LDQS_t shift backwards according to the first delay amount adjustment signal FDA_CODE. For another example, when the write leveling state WS of the write leveling index signal WL_INDEX is equal to 0 (i.e. the level of the write leveling index signal WL_INDEX is low), the lower true DQS signal LDQS_t leads the true clock signal CK_t, and the tracking delay circuit 34 may decrease the value of the first delay amount FDA to make the lower true DQS signal LDQS_t shift forwards according to the first delay amount adjustment signal FDA_CODE.

As a result, the storage device 48 may support a plurality of candidate values for the first delay amount FDA, and may be further arranged to update the value of the first delay amount FDA by a candidate value that is selected from the plurality of candidate values in response to the write leveling state WS of the write leveling index signal WL_INDEX (i.e. the first delay amount FDA is adjusted according to the first delay amount adjustment signal FDA_CODE), wherein a tDQSCK setting code of the candidate value may also be updated at the same time.

In this embodiment, the storage device 48 may be coupled to the tracking delay circuit 34 and the phase detector circuit 26 (more particularly, the phase detector 46), and may include, but is not limited to: a plurality of electronic fuses (eFuses) 50_1, 50_2, . . . , 50_N (N>1). The eFuses 50_1-50_N may have $2^N$ states, and the $2^N$ states correspond to the plurality of candidate values for the first delay amount FDA, respectively. The storage device 48 may be further arranged to receive a control signal SET_FDA and record the tDQSCK setting code (which corresponds to the current setting of the first delay amount FDA) when the write leveling index signal WL_INDEX toggles after the value of the first delay amount FDA is updated by the candidate value, wherein the control signal SET_FDA may control the storage device 48 to transmit the first delay amount adjustment signal FDA_CODE to the tracking delay circuit 34, and a program operation is performed on the eFuses 50_1-50_N to store the tDQSCK setting code that is an N-bit code. After the eFuses 50_1-50_N are programmed at the end of the self-calibration process, a tDQSCK setting code indicative of a calibrated setting of the first delay amount FDA is recorded for later use. That is, when the memory device 100 operates under a normal mode, the storage device 48 may refer to the tDQSCK setting code to control the setting of the first delay amount FDA.

Figure 3:
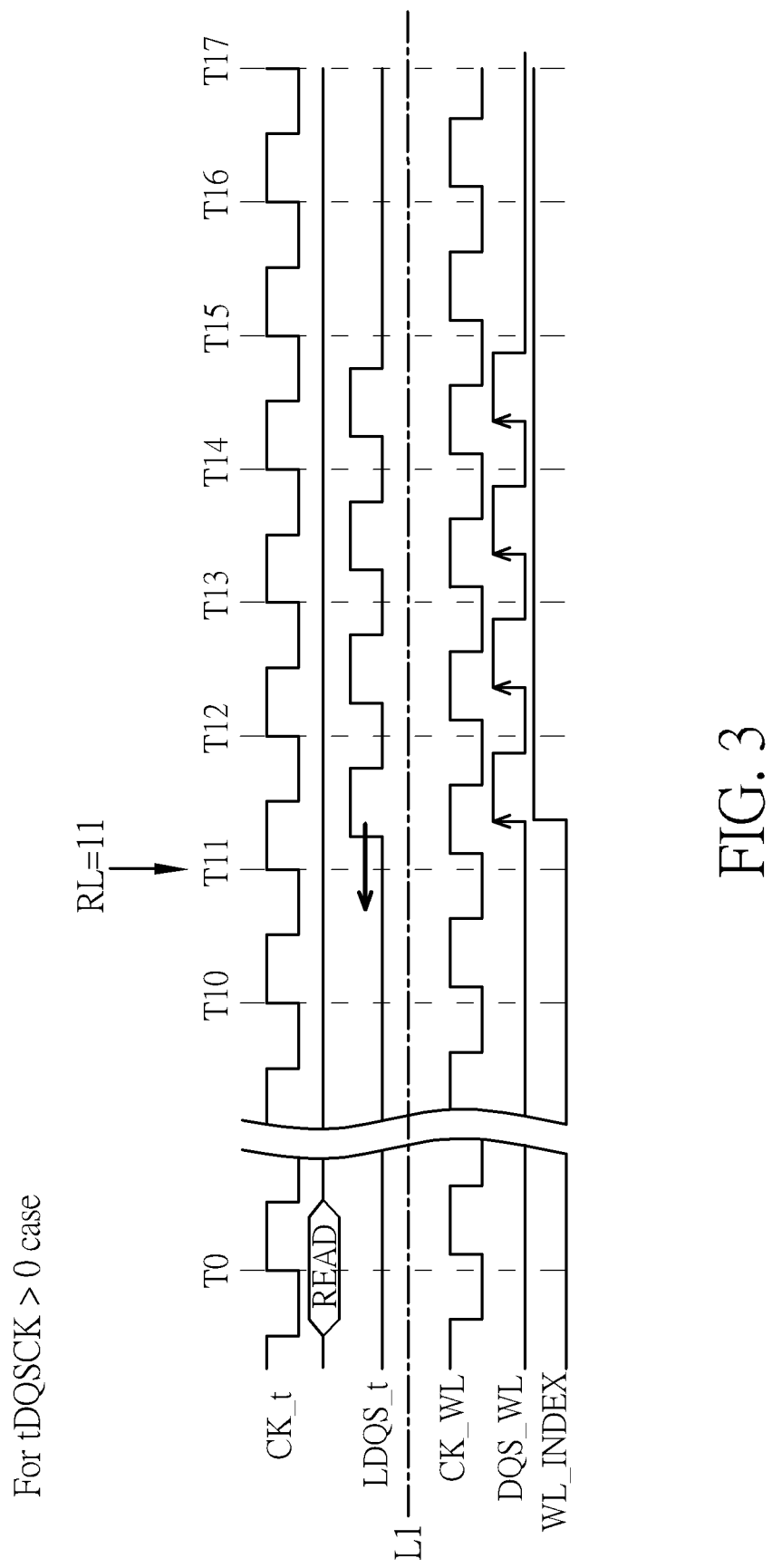
FIG. 3 is a timing diagram of a clock signal, a DQS signal, and a write leveling index signal obtained by the signal processing circuit shown in FIG. 2 according to an embodiment of the present invention.

FIG. 3 is a timing diagram of a clock signal, a DQS signal, and a write leveling index signal obtained by the signal processing circuit 200 shown in FIG. 2 according to an embodiment of the present invention. As shown in FIG. 3, an read command (labeled as"READ"), such as an MPR read command, is given at a time point T0, and a read latency RL is equal to 11 (i.e. the read command is first operated at a time point T11). The signals illustrated above a dashed line L1, such as the true clock signal CK_t and the lower true DQS signal LDQS_t, are external signals of the signal processing circuit 200, and the signals illustrated below the dashed line L1, such as a clock write leveling signal CK_WL, a DQS write leveling signal DQS_WL, and the write leveling index signal WL_INDEX, are internal signals of the signal processing circuit 200, wherein the true clock signal CK_t corresponds to the clock write leveling signal CK_WL, and the lower true DQS signal LDQS_t corresponds to the DQS write leveling signal DQS_WL. Since the lower true DQS signal LDQS_t lags behind the true clock signal CK_t, the tDQSCK of the memory device 100 (e.g. the DRAM) including the signal processing circuit 200 is larger than 0. In addition, the write leveling state WS of the write leveling index signal WL_INDEX is equal to 1 after the DQS write leveling signal DQS_WL strobes the clock write leveling signal CK_WL near a middle timing between the time point T11 and a time point T12.

In this embodiment, since the tDQSCK of the memory device 100 including the signal processing circuit 200 is larger than 0, the tracking delay circuit 34 of the signal processing circuit 200 may increase the value of the first delay amount FDA to make the lower true DQS signal LDQS_t shift backwards. In the process of shifting the lower true DQS signal LDQS_t backwards, candidate values for the first delay amount FDA may be supported by the tracking delay circuit 34, wherein the value of the first delay amount FDA is updated by a candidate value that is selected from the candidate values in response to the write leveling state WS of the write leveling index signal WL_INDEX. In addition, when the rising edge of the lower true DQS signal LDQS_t crosses the rising edge of the true clock signal CK_t in the process of shifting the lower true DQS signal LDQS_t backwards, the rising edge of the DQS write leveling signal DQS_WL will also cross the rising edge of the clock write leveling signal CK_WL. As a result, the write leveling index signal WL_INDEX will toggle (i.e. the write leveling state WS of the write leveling index signal WL_INDEX is changed from 1 to 0). At this moment, the tDQSCK of the memory device 100 is close to 0 and the tDQSCK setting code is stored in the storage device 48. After the self-calibration flow, a program operation is performed on the eFuses 50_1-50_N to store the tDQSCK setting code of the candidate value in the eFuses 50_1-50_N.

Figure 4:
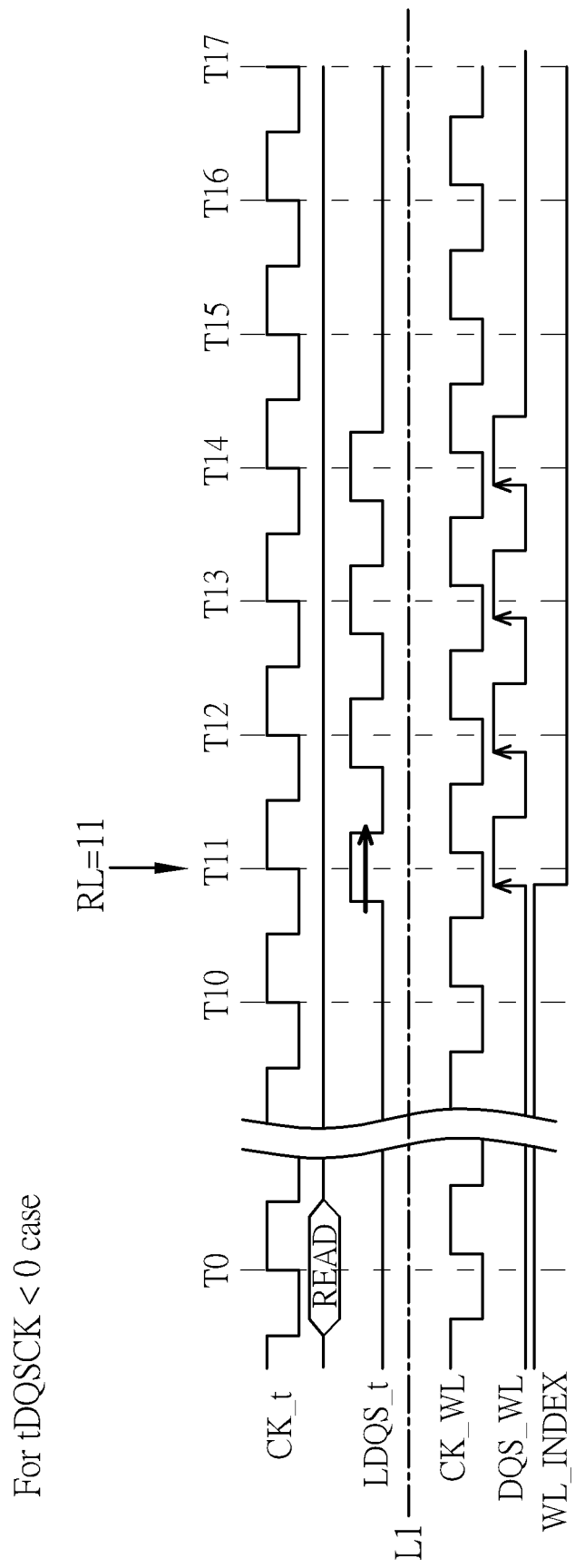
FIG. 4 is a timing diagram of a clock signal, a DQS signal, and a write leveling index signal obtained by the signal processing circuit shown in FIG. 2 according to another embodiment of the present invention.

FIG. 4 is a timing diagram of a clock signal, a DQS signal, and a write leveling index signal obtained by the signal processing circuit 200 shown in FIG. 2 according to another embodiment of the present invention. The difference between FIG. 3 and FIG. 4 is that the lower true DQS signal LDQS_t leads the true clock signal CK_t in FIG. 4, and the tDQSCK of the memory device 100 including the signal processing circuit 200 is smaller than 0. In addition, the write leveling state WS of the write leveling index signal WL_INDEX is equal to 0 after the DQS write leveling signal DQS_WL strobes the clock write leveling signal CK_WL near the time point T11. For brevity, similar description is omitted here.

In this embodiment, since the tDQSCK of the memory device 100 including the signal processing circuit 200 is smaller than 0, the tracking delay circuit 34 of the signal processing circuit 200 may decrease the value of the first delay amount FDA to make the lower true DQS signal LDQS_t shift forwards. In the process of shifting the lower true DQS signal LDQS_t forwards, candidate values for the first delay amount FDA may be supported by the tracking delay circuit 34, wherein the value of the first delay amount FDA is updated by a candidate value that is selected from the candidate values in response to the write leveling state WS of the write leveling index signal WL_INDEX. In addition, when the rising edge of the lower true DQS signal LDQS_t crosses the rising edge of the true clock signal CK_t in the process of shifting the lower true DQS signal LDQS_t forwards, the rising edge of the DQS write leveling signal DQS_WL will also cross the rising edge of the clock write leveling signal CK_WL. As a result, the write leveling index signal WL_INDEX will toggle (i.e. the write leveling state WS of the write leveling index signal WL_INDEX is changed from 0 to 1). At this moment, the tDQSCK of the memory device 100 is close to 0 and the tDQSCK setting code is stored in the storage device 48. After the self-calibration flow, a program operation is performed on the plurality of eFuses 50_1-50_N to store the tDQSCK setting code of the candidate value in the eFuses 50_1-50_N.

Figure 5:
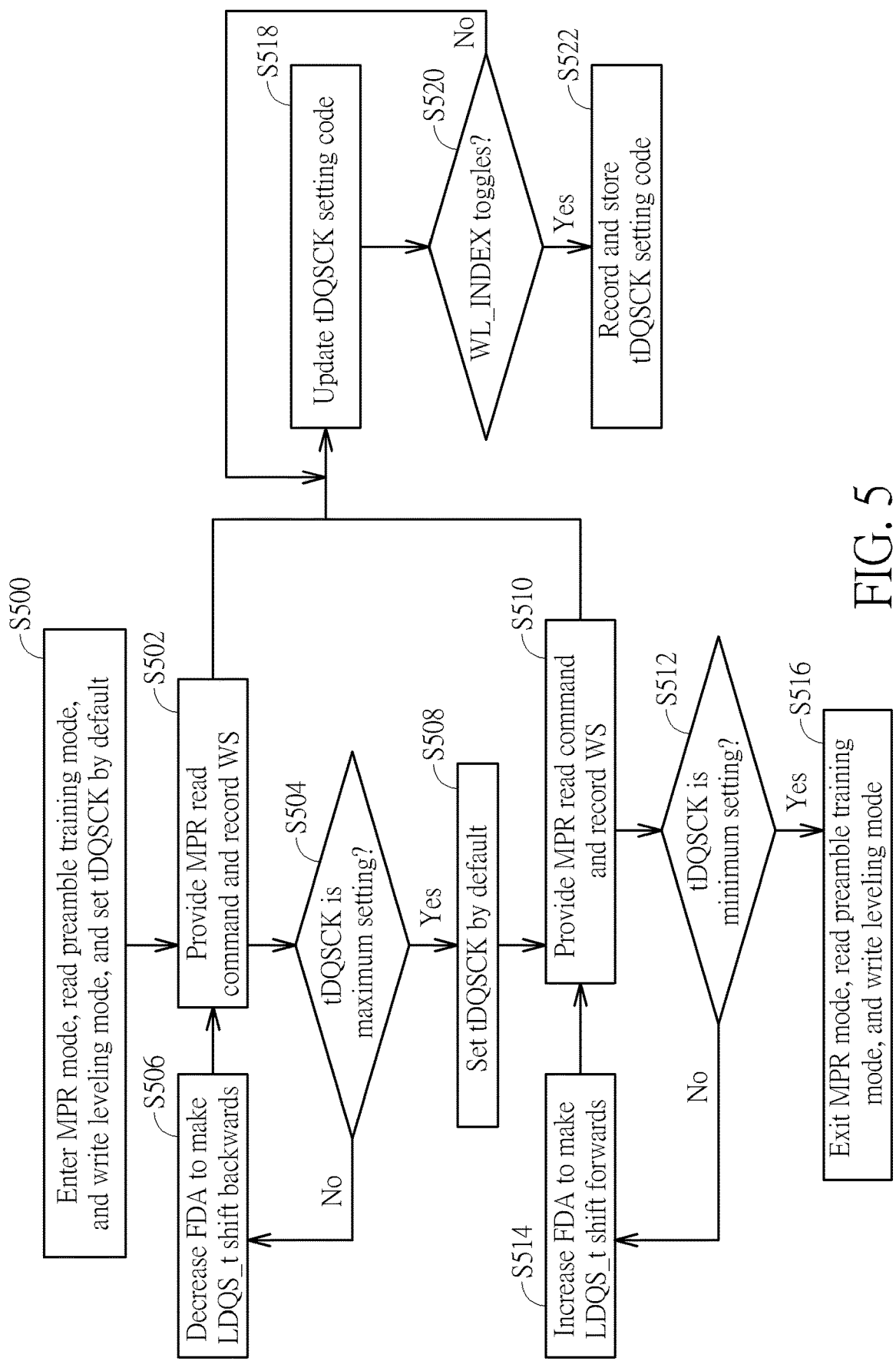
FIG. 5 is a flow chart of a method for self-calibrating a tDQSCK according to an embodiment of the present invention.

FIG. 5 is a flow chart of a method for self-calibrating a tDQSCK according to an embodiment of the present invention. Provided that the result is substantially the same, the steps are not required to be executed in the exact order shown in FIG. 5. For example, the method shown in FIG. 5 may be employed by the signal processing circuit 200 that may be a part of the memory device 100.

In Step S500, the memory device 100 (e.g. the DRAM) that includes the signal processing circuit 200 enters the MPR mode, the read preamble training mode, and the write leveling mode, and the tDQSCK setting of the memory device 100 is set by default.

In Step S502, the read command (e.g. the MPR read command) is provided to the signal processing circuit 200 and the write leveling state WS of the write leveling index signal WL_INDEX is recorded.

In Step S504, it is determined that whether the tDQSCK is a maximum setting of the tDQSCK of the memory device 100. If Yes, Step S508 is entered; if No, Step S506 is entered.

In Step S506, in response to the tDQSCK not being the maximum setting of the tDQSCK of the memory device 100, the value of the first delay amount FDA is decreased to make the lower true DQS signal LDQS_t shift forwards, and Step S502 is returned.

In Step S508, in response to the tDQSCK being the maximum setting of the tDQSCK of the memory device 100, the tDQSCK setting of the memory device 100 is set by default again.

In Step S510, the read command (e.g. the MPR read command) is provided to the signal processing circuit 200 and the write leveling state WS of the write leveling index signal WL_INDEX is recorded again.

In Step S512, it is determined that whether the tDQSCK is a minimum setting of the tDQSCK of the memory device 100. If Yes, Step S516 is entered; if No, Step S514 is entered.

In Step S514, in response to the tDQSCK not being the minimum setting of the tDQSCK of the memory device, the value of the first delay amount FDA is increased to make the lower true DQS signal LDQS_t shift backwards, and Step S510 is returned.

In Step S516, in response to the tDQSCK being the minimum setting of the tDQSCK of the memory device 100, the memory device 100 exits the MPR mode, the read preamble training mode, and the write leveling mode.

In Step S518, the tDQSCK setting code is updated according to the latest tDQSCK setting code that is selected in step S506 or step S514.

In Step S520, it is determined that whether the write leveling index signal WL_INDEX toggles. If Yes, Step S522 is entered; if No, Step S518 is returned.

In Step S522, the tDQSCK setting code is recorded and stored in the eFuses 50_1-50_N by performing the program operation on the eFuses 50_1-50_N after the self-calibration flow.

Since a person skilled in the pertinent art can readily understand details of the steps after reading above paragraphs directed to the signal processing circuit 200 shown in FIG. 2, further description is omitted here for brevity.

Figure 6:
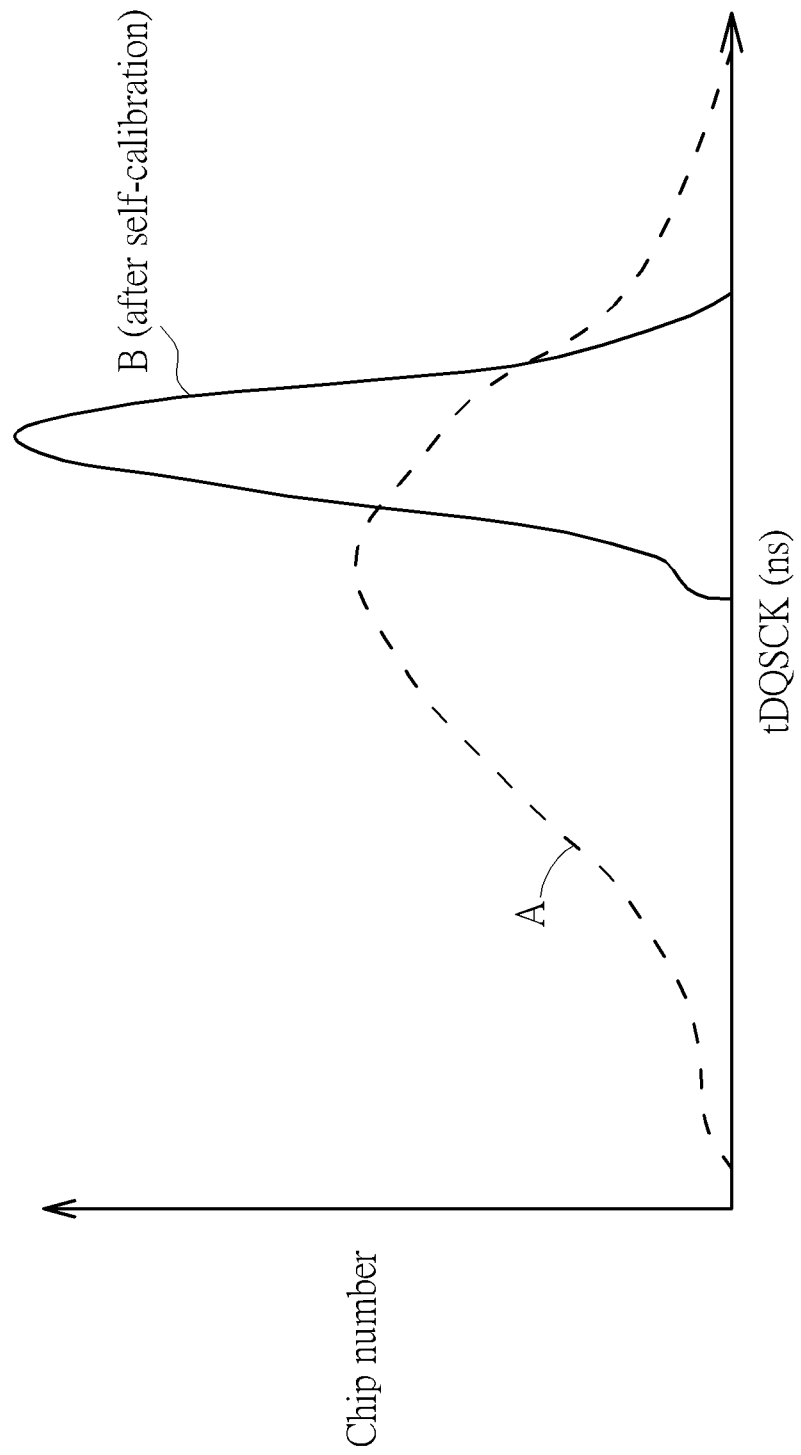
FIG. 6 is a diagram illustrating a tDQSCK distribution after self-calibration according to an embodiment of the present invention.

FIG. 6 is a diagram illustrating a tDQSCK distribution after self-calibration according to an embodiment of the present invention. The horizontal axis of the diagram shows different values of the tDQSCK, and the vertical axis of the diagram shows different numbers of chips (e.g. DRAMs), wherein the unit of the values of the tDQSCK is nanosecond (ns). As shown in FIG. 6, a curve A represented by the dashed line is an original tDQSCK distribution, and all chips in the curve A have the same tDQSCK setting code. However, in a curve B, the tDQSCK of each chip is self-calibrated by the method of the present invention. As a result, each chip in the curve B has a respective tDQSCK setting code that is suitable for each chip, respectively, and the tDQSCK distribution of the curve B may be more concentrated.

Figure 7:
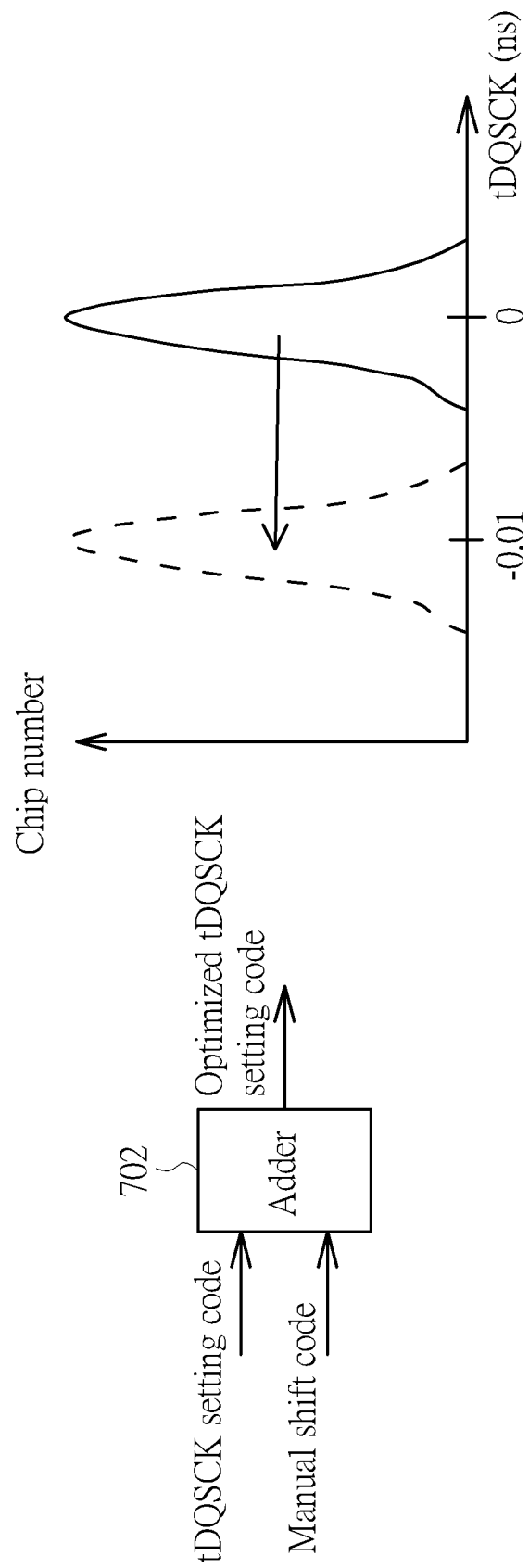
FIG. 7 is a diagram illustrating shifting of the tDQSCK distribution after self-calibration shown in FIG. 6 according to an embodiment of the present invention.

FIG. 7 is a diagram illustrating shifting of the tDQSCK distribution after self-calibration shown in FIG. 6 according to an embodiment of the present invention. After the tDQSCK of each chip is self-calibrated by the method of the present invention, a manual shift code may be added to the tDQSCK setting code for each chip. For example, the manual shift code is arranged to shift the tDQSCK of each chip to the left by 0.01, and an adder 702 is arranged to add the manual shift code to the tDQSCK setting code, to generate an optimized tDQSCK setting code for each chip. By applying the optimized tDQSCK setting code to each chip, the tDQSCK distribution after self-calibration shown in FIG. 6 is shifted to the left by 0.01.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing circuit, comprising:
a delay locked loop (DLL) circuit, arranged to receive a memory clock signal, and generate a DLL output signal according to the memory clock signal and a DLL feedback signal, wherein the DLL feedback signal is derived from the DLL output signal;
a data output path circuit, coupled to the DLL circuit, and arranged to generate a data strobe (DQS) signal according to the DLL output signal; and
a first phase detector circuit, coupled to the data output path circuit, and arranged to receive the memory clock signal and the DQS signal, and detect a phase difference between the memory clock signal and the DQS signal to generate a first phase detection result;

wherein a first delay amount is employed by the DLL circuit, and the first delay amount is adjusted according to the first phase detection result;

wherein the DLL circuit comprises:

a second phase detector circuit, arranged to receive the memory clock signal and the DLL feedback signal, and detect a phase difference between the memory clock signal and the DLL feedback signal to generate a second phase detection result;

a delay cell circuit, coupled to the second phase detector circuit and the data output path circuit, and arranged to apply a second delay amount to the memory clock signal to generate the DLL output signal;

a delay controller, coupled to the second phase detector circuit and the delay cell circuit, and arranged to control the second delay amount according to the second phase detection result; and a tracking delay circuit, coupled to the delay cell circuit and the second phase detector circuit, and arranged to apply the first delay amount to the DLL output signal to generate the DLL feedback signal.

2. The signal processing circuit of claim 1, wherein the signal processing circuit self-calibrates a tDQSCK that is a skew between a rising edge of the memory clock signal and a rising edge of the DQS signal.

3. The signal processing circuit of claim 1, wherein the second phase detector circuit comprises:

a first input buffer, coupled to the delay cell circuit, and arranged to receive and buffer the memory clock signal;

a second input buffer, coupled to the tracking delay circuit, and arranged to receive and buffer the DLL feedback signal; and a phase detector, coupled to the first input buffer, the second input buffer, and the delay controller, and arranged to detect the phase difference between the memory clock signal output from the first input buffer and the DLL feedback signal output from the second input buffer, to generate the second phase detection result.

4. The signal processing circuit of claim 1, wherein the first phase detector circuit comprises:

a first input buffer, arranged to receive and buffer the memory clock signal;

a second input buffer, coupled to the data output path circuit, and arranged to receive and buffer the DQS signal; and a phase detector, coupled to the first input buffer and the second input buffer, and arranged to detect the phase difference between the memory clock signal output from the first input buffer and the DQS signal output from the second input buffer, to generate the first phase detection result.

5. The signal processing circuit of claim 1, wherein the first phase detection result is arranged to serve as a write leveling index signal, and a write leveling state of the write leveling index signal is indicative of phase relationship between the memory clock signal and the DQS signal.

6. The signal processing circuit of claim 5, wherein when the write leveling state of the write leveling index signal is equal to a first logic value, the tracking delay circuit increases a value of the first delay amount to make the DQS signal shift backwards; and when the write leveling state of the write leveling index signal is equal to a second logic value, the tracking delay circuit decreases the value of the first delay amount to make the DQS signal shift forwards.

7. The signal processing circuit of claim 6, further comprising:

the storage device, coupled to the first phase detector circuit and the tracking delay circuit, supporting a plurality of candidate values for the first delay amount, and further arranged to generate and transmit a first delay amount adjustment signal to the tracking delay circuit according to the first phase detection result, to update the value of the first delay amount by a candidate value that is selected from the plurality of candidate values in response to the write leveling state of the write leveling index signal, wherein the first delay amount is adjusted according to the first delay amount adjustment signal.

8. The signal processing circuit of claim 7, wherein the storage device is further arranged to receive a control signal and record a setting code of the candidate value when the write leveling index signal toggles after the value of the first delay amount is updated by the candidate value, wherein the control signal controls the storage device to transmit the first delay amount adjustment signal to the tracking delay circuit.

9. The signal processing circuit of claim 8, wherein the storage device comprises a plurality of electronic fuses (eFuses).

10. A method for self-calibrating a tDQSCK, wherein the tDQSCK is a skew between a rising edge of a memory clock signal and a rising edge of a data strobe (DQS) signal, and the method comprises:

entering a multi-purpose register (MPR) mode, a read preamble training mode and a write leveling mode, and setting a tDQSCK setting by default;

providing a read command and recording a write leveling state of a write leveling index signal, wherein the write leveling state of the write leveling index signal is indicative of phase relationship between the memory clock signal and the DQS signal;

determining whether the tDQSCK is a maximum setting of the tDQSCK, wherein in response to the tDQSCK being not the maximum setting of the tDQSCK, a value of a delay amount is decreased to make the DQS signal shift forwards, the read command is provided again, and the write leveling state of the write leveling index signal is recorded again; and in response to the tDQSCK being the maximum setting of the tDQSCK, setting the tDQSCK setting by default again;

determining whether the tDQSCK is a minimum setting of the tDQSCK, wherein in response to the tDQSCK being not the minimum setting of the tDQSCK, the value of the delay amount is increased to make the DQS signal shift backwards, the read command is provided again, and the write leveling state of the write leveling index signal is recorded again; and in response to the tDQSCK being the minimum setting of the tDQSCK, exiting the read preamble training mode, the write leveling mode, and the MPR mode;

updating a tDQSCK setting code until the write leveling index signal toggles; and recording the tDQSCK setting code.

11. The method of claim 10, wherein the read command is an MPR read command.

12. The method of claim 10, wherein the delay amount has a plurality of candidate values, and updating the tDQSCK setting code until the write leveling index signal toggles further comprises:

updating the value of the delay amount by a candidate value that is selected from the plurality of candidate values until the write leveling index signal toggles.

13. The method of claim 12, wherein recording the tDQSCK setting code comprises:
   recording the tDQSCK setting code that corresponds to the candidate value that makes the write leveling index signal toggle.

14. The method of claim 10, wherein in response to toggling of the write leveling index signal, the tDQSCK is close to 0.

15. The method of claim 10, wherein recording the tDQSCK setting code further comprises:
   performing a program operation on a plurality of electronic fuses (eFuses) to store the tDQSCK setting code in the plurality of eFuses.

* * * * *